United States Patent
Chung et al.

(10) Patent No.: US 7,955,100 B2
(45) Date of Patent: Jun. 7, 2011

(54) CONNECTOR AND ELECTRONIC DEVICE HAVING THE SAME

(75) Inventors: Ming-Hung Chung, Taipei (TW); Shu-Fen Huang, Taipei (TW); Yu-Chen Lee, Taipei (TW); Tsung-Hua Wu, Taipei (TW)

(73) Assignee: ASUSTeK Computer Inc., Taipei (TW)

( * ) Notice: Subject to any disclaimer, the term of this patent is extended or adjusted under 35 U.S.C. 154(b) by 0 days.

(21) Appl. No.: 12/711,257

(22) Filed: Feb. 24, 2010

(65) Prior Publication Data

US 2011/0003490 A1  Jan. 6, 2011

(30) Foreign Application Priority Data

Jul. 1, 2009 (TW) ................. 98122250 A

(51) Int. Cl.
*H01R 13/62* (2006.01)
(52) U.S. Cl. ........................ 439/157; 439/327
(58) Field of Classification Search .................. 439/157, 439/160, 328, 327
See application file for complete search history.

(56) References Cited

U.S. PATENT DOCUMENTS

| | | | | |
|---|---|---|---|---|
| 5,647,755 A | * | 7/1997 | Hida et al. ................. | 439/328 |
| 5,726,865 A | * | 3/1998 | Webb et al. ................. | 361/801 |
| 6,126,471 A | * | 10/2000 | Yu et al. ................. | 439/327 |
| 6,219,251 B1 | * | 4/2001 | Wang ................. | 361/752 |
| 6,269,001 B1 | | 7/2001 | Matteson et al. | |
| 7,004,773 B1 | | 2/2006 | Poh et al. | |
| 7,371,097 B1 | | 5/2008 | Pennypacker et al. | |
| 7,484,978 B1 | * | 2/2009 | Gao ................. | 439/160 |
| 7,637,748 B2 | * | 12/2009 | Chung et al. ................. | 439/59 |
| 2008/0220637 A1 | * | 9/2008 | Guan et al. ................. | 439/157 |
| 2009/0273904 A1 | * | 11/2009 | Chung et al. ................. | 361/700 |

FOREIGN PATENT DOCUMENTS

| | | |
|---|---|---|
| CN | 2380959 | 5/2000 |
| TW | M263549 | 5/2005 |

OTHER PUBLICATIONS

"Extended Search Report of European Counterpart Application", issued on Oct. 15, 2010, p1-p8, in which the listed references were cited.

* cited by examiner

*Primary Examiner* — Hae Moon Hyeon
(74) *Attorney, Agent, or Firm* — Jianq Chyun IP Office

(57) ABSTRACT

An electronic device and a connector thereof are provided. The electronic device includes a circuit board and an electronic device and the connector disposed on the circuit board. The connector includes a slot and a cap. The slot is configured for a card module to be plugged in along a plugging direction. A first pillar portion and a second pillar portion are at two opposite sides of the slot. The cap is disposed on a top of the first pillar portion and has a first protruding portion. The first protruding portion protrudes out of a side of the first pillar portion away from the second pillar portion while observing along the plugging direction.

14 Claims, 4 Drawing Sheets

CONNECTOR AND ELECTRONIC DEVICE HAVING THE SAME

CROSS-REFERENCE TO RELATED APPLICATION

This application claims the priority benefit of Taiwan application serial no. 98122250, filed on Jul. 1, 2009. The entirety of the above-mentioned patent application is hereby incorporated by reference herein and made a part of this specification.

BACKGROUND OF THE INVENTION

1. Field of the Invention

The present invention generally relates to a connector and an electronic device having the same, in particular, to a connector capable of plugging a card module and an electronic device having the same.

2. Description of Related Art

In recent years, with the enormous progress of the computer technology, the operating speed of the computer is continuously increased, and the heat generation rate of electronic elements within a computer host continuously rises correspondingly. In order to prevent the electronic elements within the computer host from overheating to cause a temporary or permanent failure to the electronic element, how to provide sufficient heat dissipation performance to the electronic elements within the computer is accordingly important. Besides cooling fans disposed at a computer housing and a power supply, heat dissipation devices need to be additionally disposed to the electronic elements whose temperature easily rises such as a central processing unit (CPU), a graphics processing unit (GPU), and a card module on a motherboard to reduce temperature of the electronic elements in high-speed operation. Thus, the computer host operates more smoothly.

Presently, a heat dissipation plate is usually disposed on the card module directly to dissipate heat, and then the heat dissipation plate is utilized to increase heat dissipation area. However, heat cannot be effectively dissipated out of the card module only in a natural convection way, and thus heat dissipation effect is not good. Thus, disposing cooling fans on the connectors and producing a forced convection is one solution of dissipating heat for the card module.

In addition, due to a problem of space disposing inside the computer host, a card module's plugging and disassembling operation is often interfered with a CD-ROM drive, a hard disk, an expansion card or cables. This results bolts located at two sides of the connector can't rotate, further results the card module can't plug into the connector or disassemble from the connector. Thus, a bolt adjacent to other element is designed to un-rotate in a conventional connector, and the bolt have no protruding portion protruded out of a slot for user's twisting.

However, the cooling fans for heat dissipation to the card module just fix in the connector via the protruding portion of the bolt. Thus, there still not have a suitable design to solve the problems of the card module's plugging and disassembling and the card module's low heat dissipating efficiency at the same time.

SUMMARY OF THE INVENTION

Accordingly, the present invention is directed to a connector for solving the problem that the card module is not easy to plug into the connector and disassemble from the connector and the problem of the card module's low heat dissipating efficiency at the same time.

The present invention is further directed to an electronic device having the connector.

The present invention provides a connector including a slot and a cap. The slot is configured for a card module to be plugged in along a plugging direction. A first pillar portion and a second pillar portion are at two opposite sides of the slot. The cap is disposed on a top of the first pillar portion and has a first protruding portion. The first protruding portion protrudes out of a side of the first pillar portion away from the second pillar portion.

The present invention provides an electronic device including a circuit board, multiple electronic elements disposed on the circuit board, and the above connector.

In an embodiment of the electronic device and the connector, the connector further comprises a bolt pivoted at the second pillar rotationally, used for wedging the card module when the card module plugs in the slot. In addition, the bolt has a second protruding portion protruded out of a side of the second pillar away from the first pillar when the card module is wedged by the bolt.

In an embodiment of the electronic device and the connector, the cap further comprises a hook, the hook is wedged in the first pillar when the cap is plugged to the first pillar along the plugging direction.

In an embodiment of the electronic device and the connector, the cap and the first pillar are integral.

In an embodiment of the electronic device and the connector, the cap further comprises a stopper disposed aside the first protruding portion, the stopper and the first protruding portion are applied to wedge with a fixing frame of a frame.

In an embodiment of the electronic device and the connector, the connector further comprises a spring embedded in a side of the first pillar toward the second pillar for wedging the card module.

In view of the above, in the electronic device and the connector of the present invention, the first protruding portion of the cap is provided to wedge with the fan, and there is no difficult for the card module's plugging and disassembling. The cap is not to be twist when the card module is plugged and disassembled to the connector.

These and other features, aspects and advantages of the present invention will become better understood with regard to the following description, appended claims, and accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
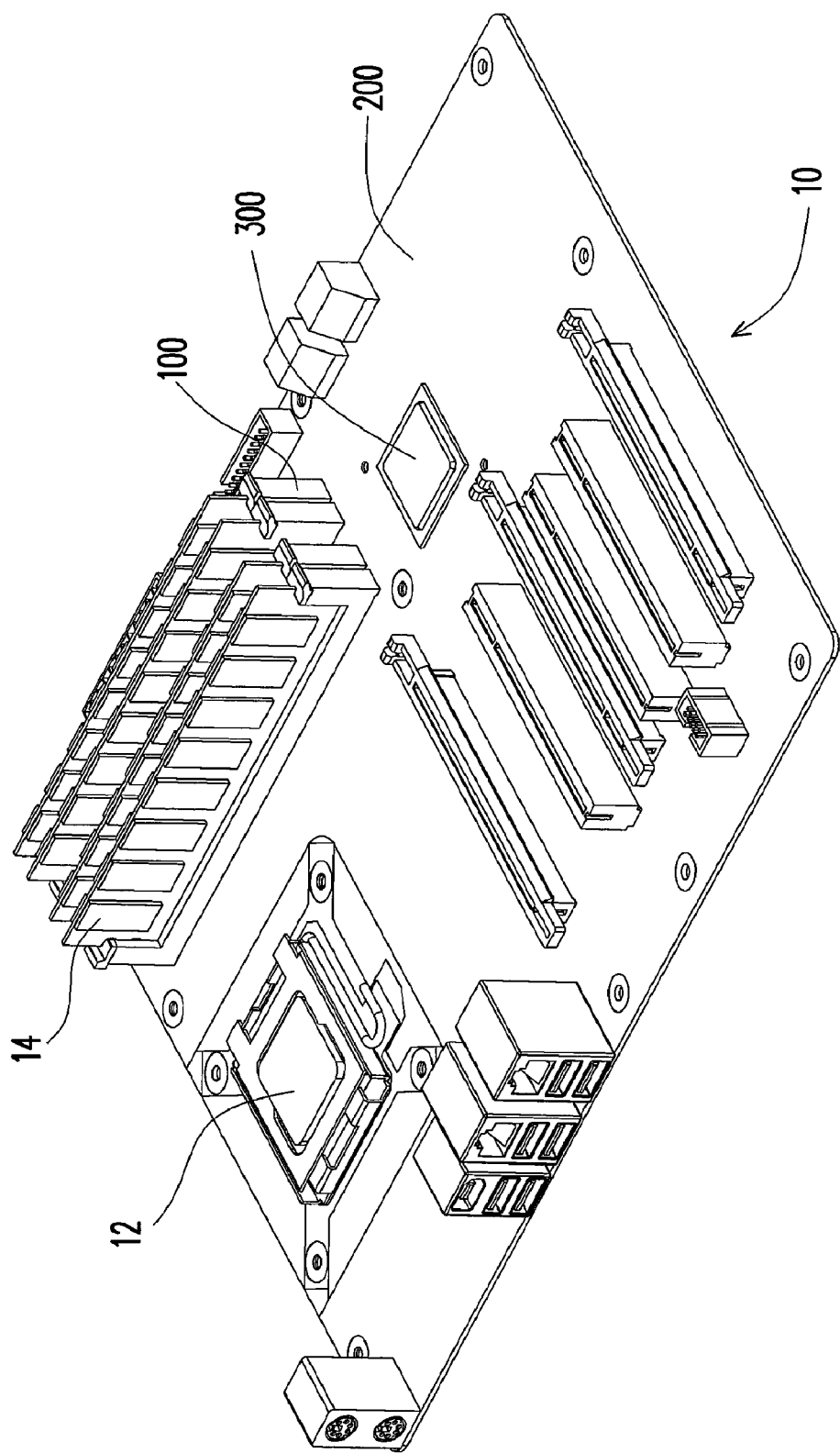
FIG. 1 is a schematic three-dimensional view of an electronic device according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic three-dimensional view of an electronic device according to an embodiment of the present invention. Referring to FIG. 1, the electronic device 10 in this embodiment includes a circuit board 200 and an electronic element 300 disposed on the circuit, and multiple connectors 100. The electronic device is, for example, a mother board of a computer. In this embodiment, there is just an electronic element 300 showed in FIG. 1, and the amount of the electronic element 300 don't have any limitation, the electronic element 300 can be south bridge chip, a north bridge chip, networking chip, graphics processing unit, sound chip, capacitor, resistance or other electronic element. This embodiment provides an example of multiple connectors, but the amount of connectors 100 can be just one. In addition, the central processing unit 12, the card module 14, and the expansion card (not shown) can be disposed on the electronic device 10 of this embodiment selectively.

Figure 2:
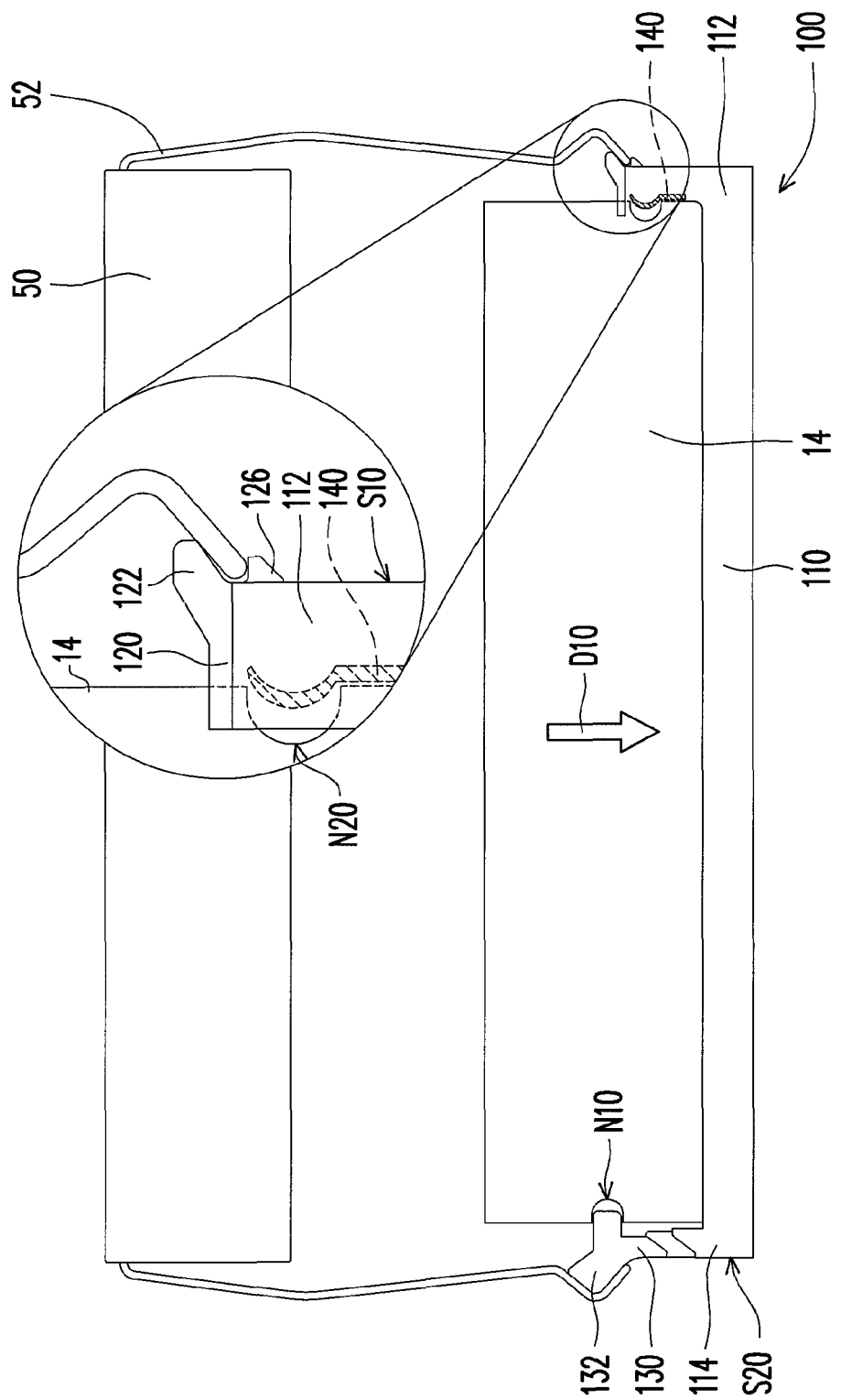
FIG. 2 is a side view of a connector of the electronic device in FIG. 1.

FIG. 2 is a side view of a connector of the electronic device in FIG. 1. Referring to FIG. 2, the connector 100 in this embodiment includes a slot 110 and a cap 120, the connector 100 is, for example, a memory connector, and card module 14 plugging in the connector 100 is, for example, a memory module. In order to facilitate the description, the FIG. 2 has a local enlargement show of the cap 120, and shows the card module 14 and a fan 50. The slot 110 is configured for a card module 14 to be plugged in along a plugging direction D10. A first pillar 112 and a second pillar 114 are at two opposite sides of the slot 110. The cap 120 is disposed in a top of first pillar 112 and has a first protruding portion 122. The first protruding portion 122 protrudes out of a side S10 of the first pillar portion 112 away from the second pillar portion 114 while observing along the plugging direction D10. The fan 50 can be wedged with the first protruding portion 122, to produces a forced convection to dissipate heat for the card module. This further prevents the card module 14 from overheating to cause a temporary or permanent failure to the card module 14.

More specially, the cap 120 can be set in a crowded location of the electronic device 10 in FIG. 1. For example, variety of cards can be plugged in the electronic device 10, the disposing of these cards maybe decrease the operating space when the card module 14 would be plugged into the connector 100 and disassembled from the connector 100. Thus, in this embodiment, the disposing of the cap 120 having the first protruding portion 122 in a side of the slot 110 is easy to plug and disassemble the card module 14 for users, and the cap 120 don't need to be twisted outside of the slot 110. Thus, it is no difficult for the card module's plugging and disassembling by applying the cap 120 used for fixing the fan.

On the other hand, the above description about "the cap 120 is provided for the fan's wedging" is just an example, the cap 120 of this embodiment can also wedges with other device, the present invention doesn't have any limitation.

In addition, the connector 100 of this embodiment further comprises a bolt 130 pivoted at the second pillar 114 rotationally. When the card module 14 is plugged in the slot 110, the bolt 130 is wedged with a concavity N10 of the card module 14. The location of the bolt 130 may be adjacent outside of the electronic device 10 in FIG. 1, the location is less crowded in space. Although the bolt 130 be twisted to outside of the slot 110 when the card module 14 be plugged and disassembled, but this is no difficult for the card module's 14 plugging and disassembling. Besides, the bolt 130 has a second protruding portion 132. When the card module 14 be wedged by the bolt 130 (showed in FIG. 2) while observing along the plugging direction D10, the second protruding portion 132 is protruded out of a side S20 of the second pillar 114 away the first pillar 112. The second protruding portion 132 is not only applied to be a force location for a use's twisting, but also a location for the fan's 50 wedging.

Furthermore, the connector 100 further comprises a spring 140 embedded in a side of the first pillar 112 toward the second pillar 114. When the card module 14 is plugged in the slot 110, the spring 140 is wedged with another concavity N20 of the card module 14. The spring 140 can be deformed and produces a suitable wedging force. Thus, it's allowable to plug the card module 14 into the slot 110 by a suitable force, or disassemble the card module 14 from the slot 110 by the suitable force.

Figure 3:
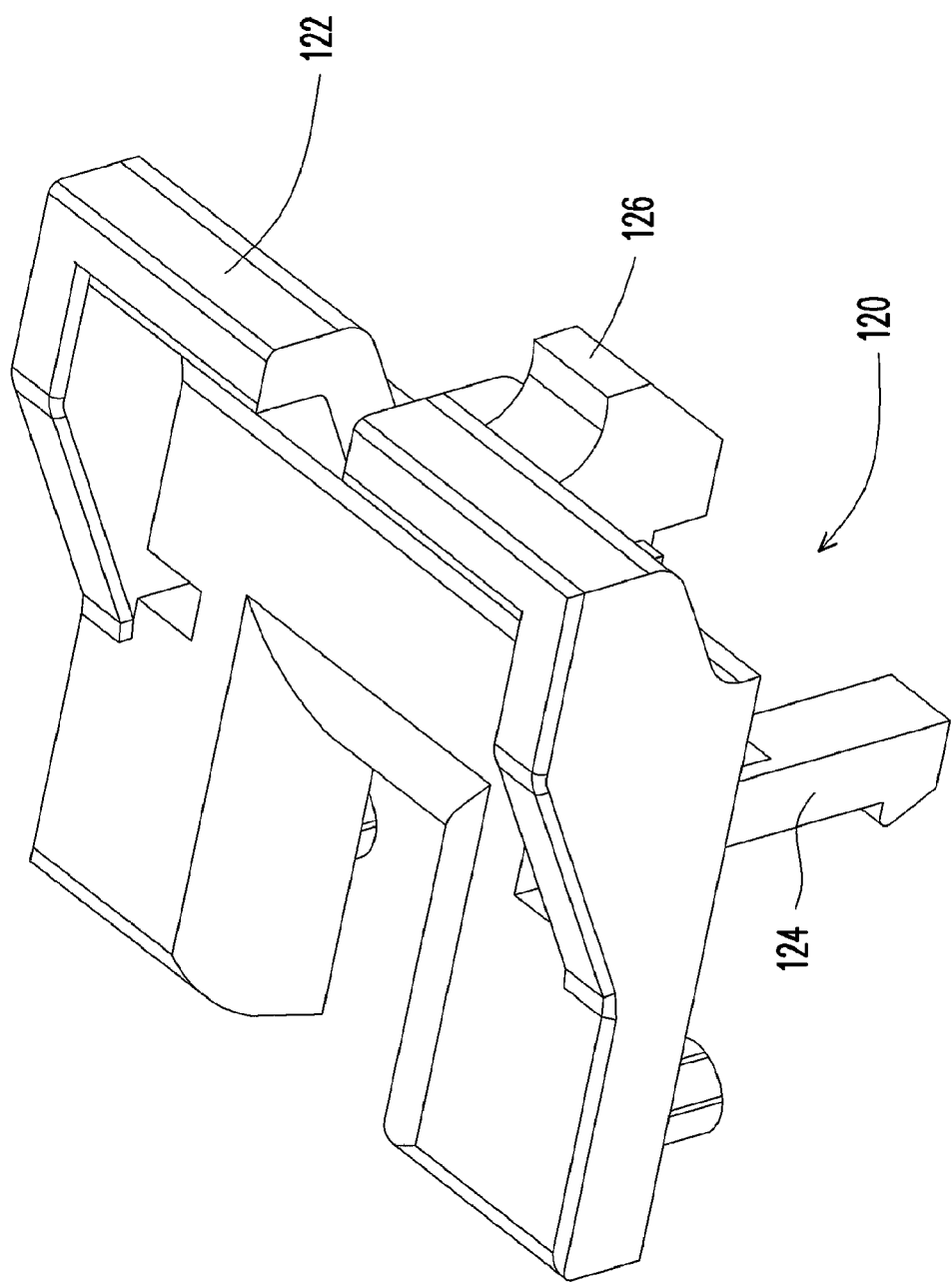
FIG. 3 is a schematic three-dimensional view of a cap of the connector in FIG. 2.

FIG. 3 is a schematic three-dimensional view of a cap of the connector in FIG. 2. Referring to FIGS. 2 and 3, the cap 120 further comprises a hook 124. When the cap 120 is plugged to the first pillar 112 along the plugging direction D10, the hook 124 is wedged inside of the first pillar 112. This makes the cap 120 fix in the first pillar 112 securely, then the fan 50 be wedged with the connector 100 securely. In addition, the cap 120 can fix in the first pillar 112 more securely by a way of dispensing. Furthermore, the cap 120 further comprises a stopper 126 located aside of the first protruding portion 122. The stopper 126 and first protruding portion 122 are used to wedge with a fixing frame 52 of the fan 50 to prevent a movement of the fixing frame 52.

Figure 4:
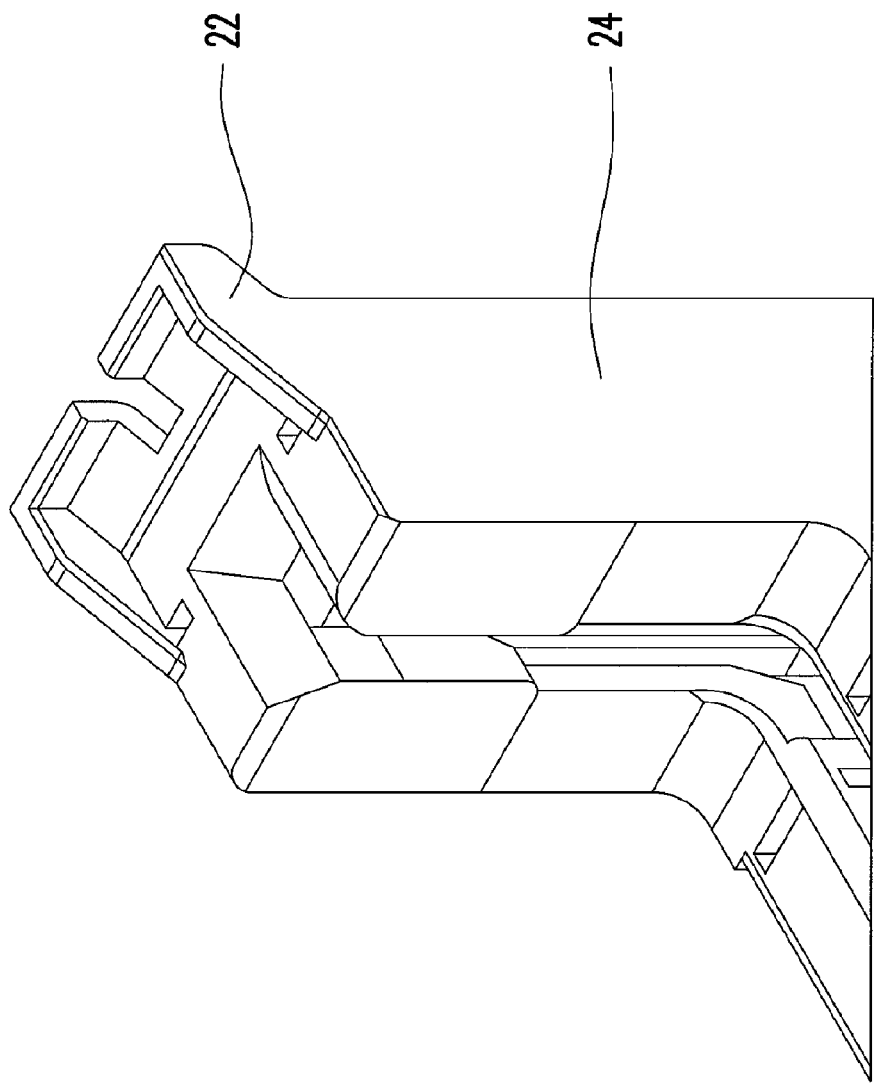
FIG. 4 is a partial three-dimensional view of a cap of the connector according to another embodiment of the present invention.

FIG. 4 is a partial three-dimensional view of a cap of the connector according to another embodiment of the present invention. Referring to FIG. 2, in the foregoing embodiment, the cap and first pillar are two elements respectively, but in this embodiment, the cap 22 and first pillar 24 are integral. The two embodiments also can reach the efficacy of the present invention.

In summary, in the electronic device and the connector of the present invention, the first protruding portion of the cap is provided to wedge with the fan. Thus, the card module has batter heat dissipation by the fan. In addition, the user can plug the card module into the connector or disassemble the card module into the connector instead of twisting the cap so that there is no difficult for the card module's plugging and disassembling.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A connector, comprising:
   a slot, configured for a card module to be plugged, the slot has a first pillar and a second pillar; and
   a cap, disposed on a top of the first pillar, and has a first protruding portion and a stopper disposed aside the first protruding portion, wherein the first protruding portion is protruded out of a side of the first pillar away from the second pillar.

2. The connector according to claim 1, further comprising a bolt pivoted at the second pillar, used for wedging the card module when the card module plugs in the slot.

3. The connector according to claim 2, wherein the bolt has a second protruding portion protruded out of a side of the second pillar away from the first pillar when the card module is wedged by the bolt.

4. The connector according to claim 1, wherein the cap further comprises a hook, the hook is wedged in the first pillar when the cap is plugged to the first pillar.

5. The connector according to claim 1, wherein the cap and the first pillar are integral.

6. The connector according to claim 1, wherein the stopper and the first protruding portion are applied to wedge with a fixing frame of a frame.

7. The connector according to claim 1, further comprises a spring embedded in a side of the first pillar toward the second pillar for wedging the card module.

8. An electronic device, comprising:
   a circuit board;
   an electronic element, disposed on the circuit board;
   a connector, disposed on the circuit board, the connector comprising:
      a slot, configured for a card module to be plugged, the slot has a first pillar and a second pillar; and
      a cap, disposed on a top of the first pillar, and has a first protruding portion and a stopper disposed aside the first protruding portion, wherein the first protruding portion is protruded out of a side of the first pillar away from the second pillar.

9. The electronic device according to claim 8, wherein the connector further comprises a bolt pivoted at the second pillar, used for wedging the card module when the card module plugs in the slot.

10. The electronic device according to claim 9, wherein the bolt has a second protruding portion protruded out of a side of the second pillar away from the first pillar when the card module is wedged by the bolt.

11. The electronic device according to claim 8, wherein the cap further comprises a hook, the hook is wedged in the first pillar when the cap is plugged to the first pillar.

12. The electronic device according to claim 8, wherein the cap and the first pillar are integral.

13. The electronic device according to claim 8, wherein the stopper and the first protruding portion are applied to wedge with a fixing frame of a frame.

14. The electronic device according to claim 8, wherein the connector further comprises a spring embedded in a side of the first pillar toward the second pillar for wedging the card module.

* * * * *